United States Patent [19]

Zega

[11] 4,116,791

[45] Sep. 26, 1978

[54] METHOD AND APPARATUS FOR FORMING A DEPOSIT BY MEANS OF ION PLATING USING A MAGNETRON CATHODE TARGET AS SOURCE OF COATING MATERIAL

[75] Inventor: Bogdan Zega, Geneva, Switzerland

[73] Assignee: Battelle Memorial Institute, Carouge/Geneva, Switzerland

[21] Appl. No.: 798,160

[22] Filed: May 18, 1977

[30] Foreign Application Priority Data

May 19, 1976 [CH] Switzerland ............... 6237/76

[51] Int. Cl.$^2$ .................................................. C23C 15/00
[52] U.S. Cl. .............................. 204/192 N; 204/298
[58] Field of Search ............ 204/192 R, 192 EC, 298, 204/192 N

[56] References Cited

U.S. PATENT DOCUMENTS

| 3,514,388 | 5/1970 | Brumfield et al. .............. 204/192 |
| 3,732,158 | 5/1973 | Przybyszewski et al. ......... 204/192 |
| 3,878,085 | 4/1975 | Corbani ........................ 204/298 |

FOREIGN PATENT DOCUMENTS

2,410,483  9/1974  Fed. Rep. of Germany ........... 204/192

OTHER PUBLICATIONS

N. Ohmae et al., "Prevention of Fretting by Ion Plated Film", Wear, vol. 30, pp. 299–309 (1974).
S. Schiller et al., "Alternating Ion Plating-A Method of High Rate Ion Vapor Deposition", J. Vac. Sci. Tech., vol. 12, pp. 858–864 (1975).

*Primary Examiner*—Aaron Weisstuch
*Attorney, Agent, or Firm*—Karl F. Ross

[57] ABSTRACT

A substrate to be coated by the ion-plating technique is placed on or in the immediate vicinity of a first cathode confronting a second cathode in an enclosure containing a rarefied gaseous atmosphere, the second cathode constituting a target of material to be deposited on the substrate. The application of a relatively high negative biasing voltage to the first cathode, relative to the grounded enclosure, generates a glow discharge resulting in ionic cleaning of the substrate. A sputtering discharge generated by a relatively low negative biasing voltage on the second cathode is intensified by a toroidal magnet on its far side (remote from the first cathode) whose lines of force penetrate the target and close in the intercathode space to form an endless track for circulating electrons. During the cleaning phase, the substrate is protected against premature particle deposition by the temporary interposition of a shield between itself and the target or by being located at a distance from the active portion of the second cathode; energization of the latter thereafter builds up a coating of target material on the cleaned substrate.

25 Claims, 9 Drawing Figures

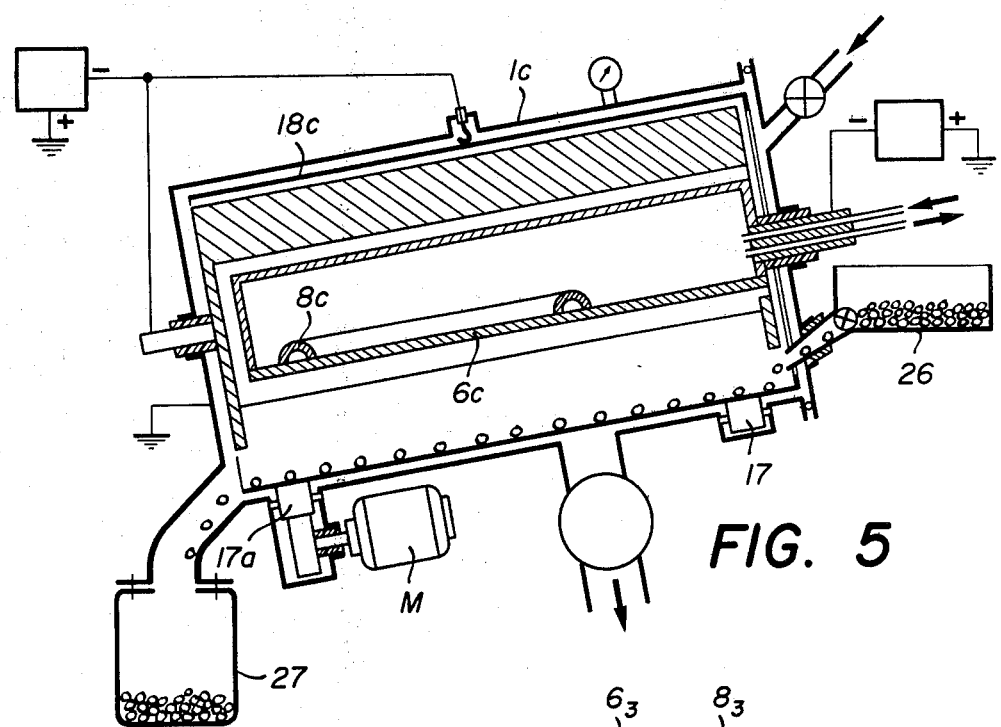
FIG. 5
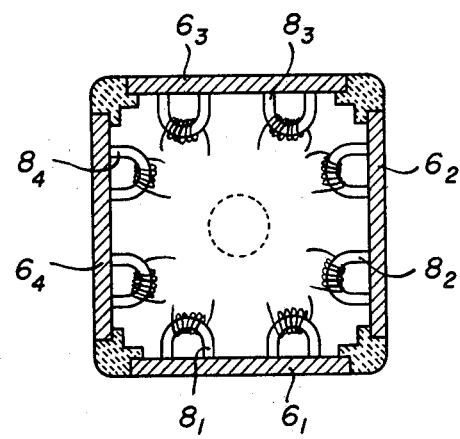
FIG. 6
FIG. 9
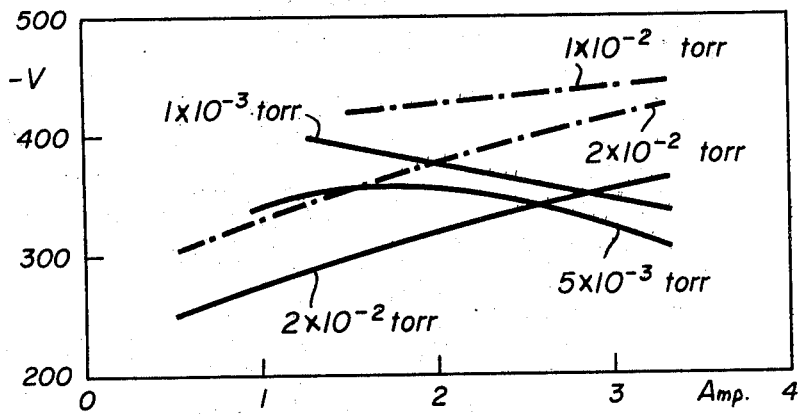

METHOD AND APPARATUS FOR FORMING A DEPOSIT BY MEANS OF ION PLATING USING A MAGNETRON CATHODE TARGET AS SOURCE OF COATING MATERIAL

FIELD OF THE INVENTION

This invention relates to a method of forming a deposit on a substrate by means of a glow discharge following ionic cleaning of the substrate, and to apparatus for performing the method.

BACKGROUND OF THE INVENTION

Methods of vacuum deposition in a glow discharge can be classified in two groups. The sputtering method, by far the best known and oldest one, consists in detaching the atoms of the material forming a cathodically connected target by bombarding it with ions of the gas present, and then condensing the atoms on a substrate. The other method consists in evaporating the material of the anodically connected target, and depositing the evaporated particles on a substrate connected to form a cathode at high negative potential and thereby subjected, simultaneously with the deposition of the evaporated substance, to intense bombardment by ions of the inert gas present in the glow discharge. Because of this bombardment, which cleans the substrate, the source has to produce more particles than the cleaning removes. This second method has great advantages over the first. The cleaning resulting from the ionic bombardment of the substrate and the projection of the particles onto the substrate give the deposit a much better adherence than if the deposit is produced by sputtering. As the material of the target can be evaporated at a high rate by means such as an electron gun, the deposition rate is greater than that obtained by sputtering in spite of the cleaning undergone by the substrate. However, this latter advantage limits the use of the method in certain circumstances. Thus, it is for example difficult to transmit the evaporated material from above downwardly or to make a deposit on a large surface. Consequently, great difficulties are encountered when it is required to use this deposition method on loose pieces, because if the pieces are placed in a basket situated below the target, most of the material will be deposited on the basket and not on the pieces which it contains.

It has been proposed to overcome this disadvantage by placing above the target deflector screens heated to a temperature higher than the condensation temperature of the evaporated material, so as to direct the vapor downwards. This method lowers the efficiency and considerably increases energy consumption. Moreover, it is impossible to use such screens with very reactive metals or with metals having a low vapor pressure.

Sputtering has also been used for deposition on a weakly polarized conducting substrate. As the principle underlying the sputtering of the target is the same as that underlying the cleaning of the substrate, the cleaning of the substrate must of necessity be very slow if a deposit is to be obtained. To this end, the substrate is polarized to a few dozen volts, 200 volts at most, so that the ionic bombardment is of low efficiency and adherence is not comparable with that obtained by intensive bombardment of the substrate pursuant to the above-described method of deposition in a glow discharge accompanied by ionic cleaning of the substrate. Moreover, the deposition rate is very low, especially in the case of deposition on items in bulk.

It has been known for some time that the presence of a magnetic field makes the glow discharge much more intense. This phenomenon, known as the Penning discharge, is used in the magnetron to compel the secondary electrons emitted by a cathode to traverse a spiral trajectory inside the magnetic field, thereby increasing the probability of ionizing collisions occurring with the atoms of the gas present.

The intensification of the discharge notably results in acceleration of the sputtering of the cathode, which is particularly advantageous for depositing coatings.

The use of cylindrical geometry for the magnetron has the disadvantage of requiring the substrate to be placed inside the cylinder. This limitation is overcome by opening the magnetron and placing a permanent magnet in the form of a closed loop behind a flat cathode, to form what might be called a flat magnetron.

The use of the flat magnetron has already been suggested in a French patent application, No. 75-33158 filed 30 Oct. 1975, published 27 May 1977 under U.S. Pat. No. 2,329,763. This French application describes a method of deposition in a glow discharge accompanied by ionic cleaning of the substrate; this technique is generally known as ion plating. However, in such a system, the coexistence of two discharges, one around the substrate and the other highly localized close to the surface of the flat magnetron, necessitates certain precautions. According to the French patent application, grids are placed between the two cathodes to reduce or suppress the interaction of these two discharges, but practice has shown that these grids become rapidly loaded with the sputtered metal, thereby progressively reducing the efficiency of the process and, consequently, diminishing one of its important advantages.

OBJECTS OF THE INVENTION

An object of my present invention is to provide an improved method of ionically cleaning and coating a substrate in the general manner just described, with utilization of magnetic intensification of a sputtering discharge on a target electrode accompanied by a glow discharge on a confronting cathode.

A related object is to provide an efficient apparatus for carrying out this method.

SUMMARY OF THE INVENTION

In accordance with my present invention, a substrate to be cleaned and coated is placed within a conductive enclosure, containing a rarefied gaseous atmosphere, in the immediate vicinity of a cathode biased sufficiently negative with reference to the enclosure to generate between them a glow discharge resulting in an ionic cleaning of the substrate, the glow discharge being accompanied by the formation of a dark space adjacent the cathode, as is well known in the art. I further energize a target electrode of coating material, confronting the cathode at a location beyond the dark space thereof within the enclosure, with a negative voltage whose absolute magnitude is lower than that of the cathode voltage so as to generate a sputtering discharge between the enclosure and the target electrode, care being taken that the potential difference between the cathode and the target electrode suffices to produce a discharge current at the latter electrode whose magnitude is about equal to the magnitude of a discharge current produced with a like energization of the target electrode if the cathode is omitted. By setting up a magnetic field across the target electrode, with lines of force closed on the side facing the cathode to establish an endless track for the circulation of secondary electrons emitted by the target electrode, I am able to intensify the rate of emission of coating-material ions toward the substrate to exceed the rate of substrate erosion by the concurrent glow discharge whereby a deposit of coating material is built up thereon.

When processing only a single substrate or group of substrates at a time, I prefer to delay the energization of the target electrode beyond the initiation of the glow discharge to establish a certain time interval for ionic cleaning before the deposition of coating material begins. During this time interval it will be advantageous to interpose a screen between the cathode and the target electrode, as also shown in the French patent application referred to. With continuous processing, on the other hand, each substrate may be first subjected to the glow discharge at a location remote from the magnetic field for ionic cleaning before being brought into the vicinity of the magnetic field for receiving coating-material ions from the target electrode.

In an apparatus according to my invention, designed to carry out this method, the discharge-intensifying magnetic field is produced by magnetic means adjacent the generally plate-shaped target electrode with north and south poles trained along concentric lines upon a surface thereof remote from the cathode. These poles are preferably part of a toroidal magnet located within a box having inlet and outlet means for the circulation of a cooling fluid therethrough, the box being closed on one side by the target electrode.

With the target electrode disposed above the cathode, the latter may be a solid plate on which the substrate or substrates can be directly supported. The reverse arrangement, however, is also possible; in that case I may design the cathode as a grid above which the substrate can be held by separate support means. The ions from the target then pass through the interstices of the grid in order to reach the substrate.

Where the substrate consists of a large number of parts, the cathode may be designed as a drum rotatable about a generally horizontal axis while the target electrode and its magnet are nonrotatably mounted therein. To facilitate continuous processing as noted above, the drum axis may be inclined so that its bottom slopes from a raised edge to a lowered opposite edge; the workpieces to be coated can then be continuously introduced through an entrance port near the raised bottom edge and withdrawn through an exit port at the lowered bottom edge. By axially separating the magnetic means from the entrance side of the drum, even while extending the target electrode all the way to that side, I may form a zone in which the entering workpieces or substrate parts are subjected only to ionic cleaning as they slide toward the region of the sputtering discharge.

The method according to the invention has all the advantages of deposition by sputtering using a magnetron, i.e. any metal or alloy and conducting substances in general can be deposited; the discharge of a magnetron is only slightly dependent on pressure; the substrate is not heated by the bombardment of energetic electrons from the target.

In the case of deposition combined with ionic cleaning of the substrate, the magnetron source presents special advantages. It is the only high-capacity source known at present in which the material of the target does not pass through a liquid phase, and in which in consequence deposition can be done downwardly. Evidently because of the cleaning of the substrate, only a source producing significantly more particles than the cleaning of the substrate removes is capable of being used for ionic deposition. Without the presence of the magnetic field on the target surface, the rate of particle supply by sputtering would be practically equal to the rate of particle removal by the cleaning of the substrate, and there would be an almost complete absence of deposit. The fact that a solid source can be used obviates heating by radiation, which in most conventional cases constitutes the main source of heat for the substrate. Finally, other ways of heating the target, for example by means of an electron gun, limit the surface area of the target to a very concentrated focus whose extent can be only slightly increased by scanning, whereas a flat-magnetron source can be constructed for practically unlimited surface areas.

All these advantages demonstrate that the present invention opens considerable fields of application to ion plating, the use of which has up to the present time been limited to substances which can be evaporated by heat.

BRIEF DESCRIPTION OF THE DRAWING

The above and other features of my invention will now be described in detail with reference to the accompanying drawing diagrammatically illustrating, by way of example, various embodiments.

In the drawings:

FIG. 5 is a view similar to FIG. 4, showing a modification of this apparatus;

FIG. 6 shows a modified magnetron usable in a system according to my invention; and;

FIGS. 7 to 9 are three explanatory diagrams.

SPECIFIC DESCRIPTION

Figure 1:
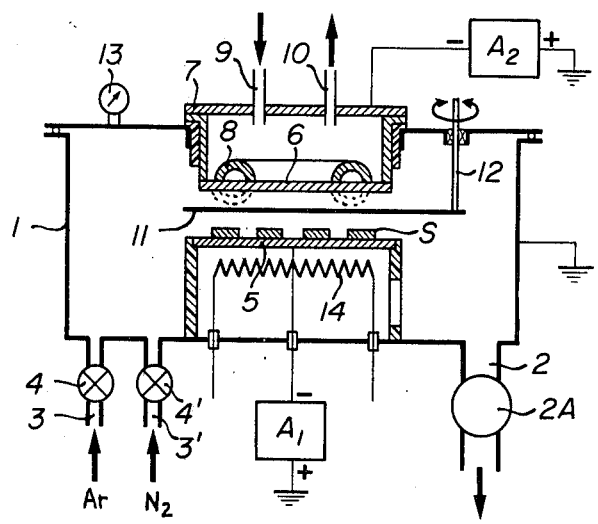
FIG. 1 is a sectional elevational view of an apparatus representing of a first embodiment of my present invention.

FIG. 1 shows a hermetically sealed enclosure 1 electrically connected to ground. The enclosure 1 is connected via an exhaust port 2 to a vacuum pump 2A of for example, the turbo-molecular type. The enclosure 1 is connected to a source of argon (not shown) via one or more conduits 3 and 3' controlled by respective precision valves 4 and 4'. Two insulated parallel electrodes 5 and 6 confront each other within housing 1. The electrode 5 is constituted by a plate designed to carry workpieces or substrates S to be ion plated, while the electrode 6 constitutes the target for supplying the material to be deposited on the substrates S. The target 6 acts as a lid for a box 7 insulated from the enclosure 1, its inner face carrying a ring 8 constituted by a permanent magnet of toroidal configuration. The cross-section of this ring is generally horseshoe-shaped with ends representing the north and south poles of the magnet. This arrangement results in the lines of force from the magnet penetrating the target 6 and forming an annular channel at the exposed lower surface thereof as indicated in dotted lines. The interior of the box 7 is connected via a first conduit 9 to a source of cold water, whereas a conduit 10 is used to discharge the water from the box 7. This water circulation cools the target 6.

The electrode 5 is connected to the negative pole of a source $A_1$ of direct current whereas the electrode 6 is connected to the negative pole of another direct-current source $A_2$. The electrodes 5 and 6 thus constitute two cathodes, the anode being constituted in this example by the grounded walls of the enclosure 1. The distance separating the two cathodes is such that the dark space of the cathode 5 does not reach the cathode 6. This distance generally lies between 50 and 70 mm.

A removable screen 11 is fixed to a rotatable shaft 12 extending through the wall of the box 7 so that the screen can be moved in a plane parallel to the cathodes 5 and 6 and situated between them. The purpose of this screen is to prevent contamination of the target 6 by the evaporated metal during initial cleaning of the substrates. The pressure in the enclosure 1 is measured by a gauge 13.

The influence of the two discharges, namely the one about the substrates carried by the electrode 5 and the other concentrated within the magnetic field of the magnetron formed by the target 6, will now be considered in detail.

Whereas the sputtering produced by a flat magnetron is of a higher order of magnitude than simple sputtering, is little dependent on pressure and can be operated at pressures less than $10^{-3}$ Torr, at which denser deposits are obtained in comparison with those resulting from hard vacuum evaporation, these low pressures do not, under the usual conditions, allow a discharge to be formed of sufficient intensity to clean the substrate.

Figure 7:
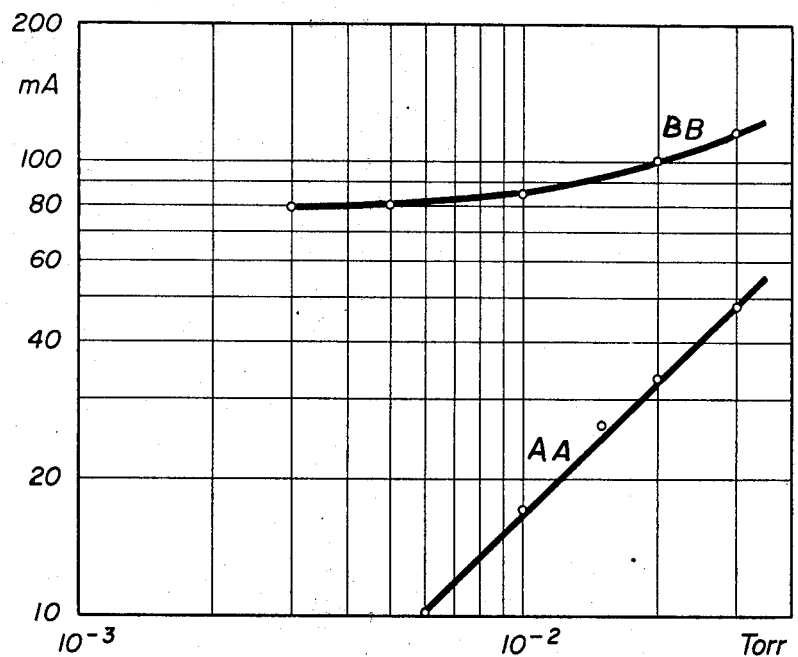

FIG. 7 is a comparative diagram intended to show that the simultaneous presence of the two discharges in proximity to the two cathodes considerably increases the discharge current of the substrate, in particular when the pressure is less than $10^{-2}$ Torr. In this diagram curve AA shows the development of the discharge current in milliamps on a substrate of 90 cm$^2$ area as a function of the argon pressure, when there is no magnetron discharge, the distance between the cathodes being 70 mm. The voltage on the substrate is $-2.5$ kV relative to ground.

Curve BB shows the development of the discharge current on the same substrate when subjected to the influence of the presence of the magnetron discharge at a current density of 40 mA/cm$^2$. It will be noted that this influence is particularly large below $10^{-2}$ Torr, whereas in the case of curve AA from this pressure down the discharge-current density becomes too weak to ensure effective bombardment of the substrate. FIG. 7 shows that the presence of the magnetron allows effective bombardment of the substrate, even at pressures lower than those normally allowable with a discharge at the substrate alone.

Figure 8:
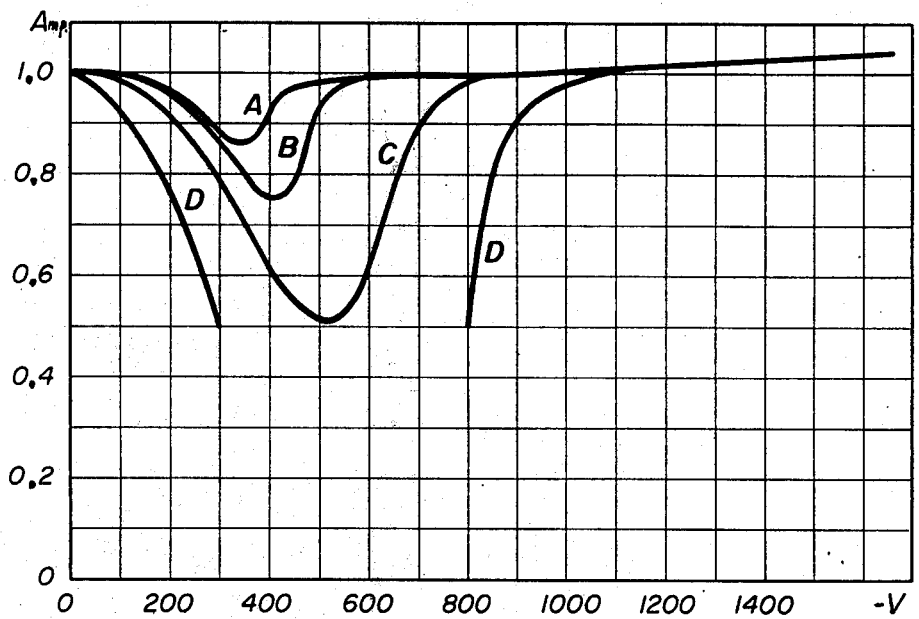

FIG. 8 shows the influence of the negatively biased substrate on the operation of the magnetron target 6, the distance between the electrodes being 50 mm and the voltage of the magnetron being between 300 and 500 V. The several curves show the development of the discharge current (in amps) as a function of the voltage $(-V)$ of the substrate for four different pressures, namely $2 \times 10^{-2}$ Torr for curve A, $1 \times 10^{-2}$ Torr for curve B, $6 \times 10^{-3}$ Torr for curve C and $4 \times 10^{-3}$ Torr for curve D. It will be noted that the intensity of the discharge at the magnetron surface reaches a minimum for substrate voltages close to the magnetron voltages. This influence is even more marked when the pressure is lowered, and it is to be noted that there is even a breakdown at pressures of the order of $10^{-3}$ Torr, whereas on raising the voltage of the substrate the magnetron is restarted, if care is taken that the dark space of the cathode 5 does not reach the cathode 6. The discharge then returns to its initial intensity.

With a permanent-magnet magnetron a small component of the magnetic field may extend as far as the substrate and this may locally modify the discharge intensity and so lead to non-uniform cleaning; to avoid this, the permanent magnet may be replaced by an electromagnet which is not energized during the cleaning of the substrate.

A general description of the process will now be given, noting that in this example the magnetic field at the surface of the target 6 is constant because of the presence of the permanent magnet 8.

The enclosure 1 is evacuated by the vacuum pump 2A to a pressure of less than $10^{-5}$ Torr, and an argon atmosphere is established in the enclosure with the aid of valve 4. A negative d.c. voltage between 2 and 5 kV is applied to the cathode 5 while the screen 11 is held between the two cathodes 5 and 6 to protect the target 6 during the ionic cleaning of the substrates.

At a pressure of $40 \times 10^{-3}$ Torr, the discharge current observed is typically of the order of 1–3 mA/cm$^2$ and decreases steadily during the first minutes of discharge.

When this current becomes stabilized (at about 50% of its initial value), the pressure is lowered to about $5 \times 10^{-3}$ Torr and a negative voltage of 400–600 V is applied to the target 6, while the screen 11 is removed from between the cathodes 5 and 6 by rotating its shaft 12.

The discharge current between the target 6 and ground is approximately 30–60 mA/cm$^2$ in terms of target area, while that between the cathode 5, supporting the substrates S, and ground increases by a factor of about 10 on removal of the screen 11 but remains about ten times less than that of the target 6.

The described device can be used for any deposition of a conducting material on a substrate which is either conducting or nonconducting as will be evident hereinafter.

Some examples of particularly interesting applications of the method heretofore described will now be given.

EXAMPLE 1

The target 6 is of pure titanium, the substrate is constituted by a mild-steel plate and the gas is very pure argon. The deposition rate is of the order of 200 Å/min per W/cm$^2$. At a power of 20 W/cm$^2$ a deposit of 1$\mu$ is obtained in 2.5 minutes. The adherence of the deposit under perpendicular traction exceeds 5 kg/mm$^2$ and its porosity, checked by a salt-spray corrosion test, is zero.

EXAMPLE 2

The target 6 is an alloy composed of Fe, Cr, Al and Y, which is able to give gas-turbine blades excellent protection against corrosion. Up to the present time, ion plating has only been applicable to alloys whose components had similar vapor pressures, and thus the magnetron source opens a new field with all the inherent advantages of deposition in a glow discharge accompanied by ionic cleaning of the substrate, and in particular the advantage of adherence.

In contrast to the substrates illustrated in FIG. 1, the substrates constituted by the turbine blades must be so disposed that the vital parts of the blades are at least 1 cm from any solid part while being in contact with the electrode 5.

After ionic cleaning in argon in a manner identical with that previously described, the current is stabilized while the same gas pressure as during cleaning is maintained. A higher pressure is maintained than in the previous case, for example $2 \times 10^{-2}$ Torr, in order to obtain better penetration of the deposit on those surfaces of the substrates which do not face the target 6.

EXAMPLE 3

This procedure involves the reactive deposition of titanium nitride from a pure-titanium target in pure nitrogen.

To this end, the device shown in FIG. 1 must be fitted with the second conduit 3' controlled by the precision valve 4' and connected to a source of $N_2$ in the proportion indicated. A radiant heater 14 is placed under the plate 5 constituting the electrode carrying the samples.

A pressure of $20-30 \times 10^{-3}$ Torr of pure argon is established in the enclosure as previously, then ionic cleaning is carried out, the valve 4' remaining closed, while the samples are heated with the aid of the radiator 14 to 450°-600° C., the temperature being controlled by a thermocouple (not shown) insulated from ground and inserted in a cavity in the sample.

When the required temperature is reached, ionic cleaning is stopped, the target 6 is polarized and the screen 11 is moved aside. Pure titanium is then deposited for two minutes with the valve 4' closed. Then the valve 4' is opened and the valve 4 is closed so that the atmosphere in the enclosure changes progressively to $N_2$, and instead of elementary Ti, TiN is now deposited, characterized by its yellow-gold color.

The pressure is then lowered to $1-5 \times 10^{-3}$ Torr, and is maintained at this value during the entire deposition process. During the transition from the argon atmosphere to the nitrogen atmosphere, an intermediate layer forms between the pure Ti and the TiN, which ensures perfect adhesion of the deposit.

The deposit obtained under stoichiometric conditions on mild steel, on stainless steel or on a stellite alloy has a hardness of about 2500 $\mu$HV and is of yellow-gold color, its shade varying according to the temperature of the substrate during deposition, which may be effected at a rate of up to 1,000 Å/min.

This result is made possible by the fact that, as explained with reference to FIG. 7, the presence of the magnetron discharge allows the substrate to be cleaned even at a pressure of less than $5 \times 10^{-3}$ Torr. Thus, tests carried out at higher pressure have shown a small quantity of TiN at the surface of the substrate in the form of a black powder, which impairs the appearance of the deposit. Without the magnetron present, it would be necessary to raise the pressure in order to maintain the cleaning of the substrate, so that it would not be possible to obtain the desired appearance for the deposit.

Tests have shown that, in order to maintain stable discharge at nitrogen pressures of less than $1 \times 10^{-2}$ Torr, it is necessary to allow the target to heat up above about 700° C., the upper limit being fixed by the melting point of the metal forming the target. To this end, while electrical contact is maintained between the magnetron and the target in order to prevent any discharge therebetween, a space is provided between them so that the cooling of the magnets of the magnetron does not impede the heating of the target. The power dissipated during the process, which can rise to about 20 W/cm², raises the temperature of the target above the aforementioned level of 700° C. The discharge, which is initially unstable, progressively stabilizes as the temperature of the target passes this temperature level.

FIG. 9 is a comparative diagram of the current/voltage characteristic of the discharge in nitrogen. The dot-dashed curves correspond to the case in which the titanium target is cooled at pressures of $1 \times 10^{-2}$ Torr and $2 \times 10^{-2}$ Torr. Below the latter value, the discharge no longer starts. The full-line curves correspond to the case in which the target is heated. When the pressure falls to $1 \times 10^{-3}$ Torr, the slope of the curve becomes more and more negative; this may be obviated by connecting a resistance in series, in this instance of about 50 ohms.

I also contemplate the reactive deposition of different metals in a nitrogen atmosphere in order to obtain their nitrides. Among the most interesting metals which can be envisaged as being utilized under conditions close to those described for titanium are zirconium, tantalum, niobium (columbium), tungsten, molybdenum, vanadium, chromium and aluminum.

Figure 2:
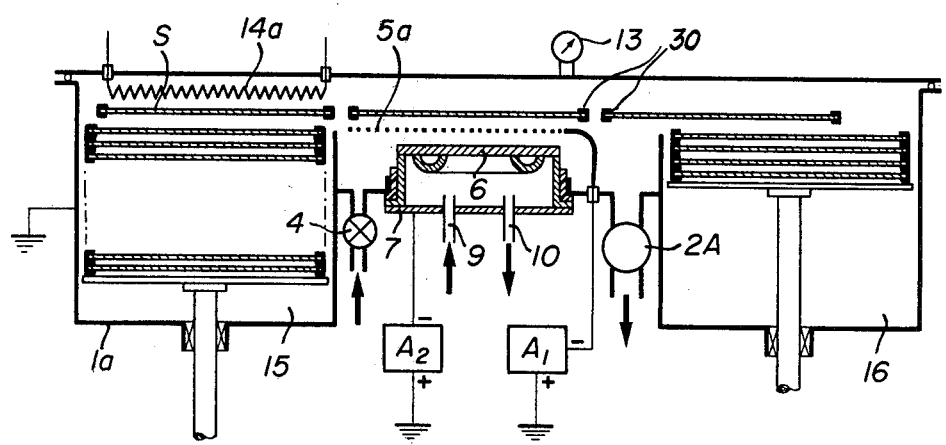
FIG. 2 is a view similar to FIG. 1, showing a second embodiment.

The device illustrated in FIG. 2 differs from that of FIG. 1 essentially in that deposition is from the bottom up, and the substrates are mobile relative to the target 6. Like elements are designated by the same reference numerals as in FIG. 1, the postscript "a" being added to the reference numerals of elements which are not identical with but equivalent to those of FIG. 1.

The enclosure 1a is fitted with two storage chambers 15 and 16 each designed to receive a stack of substrates S, which are panes of glass in this example. A similar arrangement has been disclosed in my copending application Ser. No. 741,783 filed 15 November 1976. A transport mechanism (not shown) conveys the panes S from the chamber 15 to the chamber 16 so that they pass above the target 6 and beyond a cathode formed by a grid 5a of wires stretched transversely to the path of the panes S. A resistance heater 14a is placed above the store 15 and serves to preheat the substrates S held in support 30. By way of modification the chambers 15 and 16 could be replaced by two lock chambers which allow the panes to be inserted and withdrawn so as to afford continuous production.

The cathode target 6 is placed below the grid 5a and thus occupies a position inverted with reference to that of the embodiment shown in FIG. 1. Instead of being cooled with water, the interior of the box 7 closed by the cathode 6 is cooled with air, the conduits 9 and 10 serving respectively for the inflow and the outflow of the air. This cooling is less efficient than water cooling and allows the target 6 to reach temperatures exceeding 200° C. Such temperatures are sufficient to maintain metals such as In or Sn and their alloys in the liquid state. With a magnetron source, the target is consumed only in the region of the magnetic field. In certain cases such as that shown in FIG. 2, it may be desirable to equalize the consumption of the target by keeping the target material in the molten state. This is obviously not possible in the case of FIG. 1.

As in the previous embodiment, the enclosure 1a is grounded and forms a virtual anode; the cathode-forming electrodes 5a and 6 are connected to the negative poles of respective sources of direct current, the source $A_1$ supplying the grid 5a being adjustable between 2 and 5kV, whereas the source $A_2$ supplying the cathode target 6 is adjustable between 200 and 600 V.

Two examples of the use of the device of FIG. 2 will now be described. It should be noted here that, generally, the magnetron source enables very large surfaces to be treated. However, as the sputtering of the target is concentrated in the region of the magnetic field, I normally prefer to move the substrates in order to obtain a uniform deposit.

EXAMPLE 4

The target 6 is made of a conducting compound such as TiN.

The substrates S consisting of glass panes are raised to a temperature of 300° C. by the resistance heater 14a, after which they are conveyed at constant speed from chamber 15 to chamber 16, passing above the grid 5a.

At a pressure of $2 \times 10^{-3}$ Torr and a power of 13 W/cm$^2$, the deposition rate is 300 Å/min, so that by moving the substrates S through one length of the target per minute a deposit of 300 Å is obtained.

The deposit obtained has strong reflectivity in the solar infrared range ($< 0.8 \mu$), but a transparency of 40 to 60% in the visible part of the solar spectrum. These glass panes correspond to those forming the subject of Swiss Pat. No. 558763.

EXAMPLE 5

The target 6 is an alloy consisting of 80 parts of In and 20 parts of Sn by weight. The operating gas is a mixture of Ar + O$_2$, the proportions of which depend upon the power on the target and thus the rate of deposition (see Example 3).

The glass panes move, without preheating, at a speed determined by the final required thickness.

The glass panes leaving the enclosure 1a are coated with a layer of opaque metallic appearance. On heating them for 5 to 20 minutes in air in an oven at 300° C., the deposit becomes transparent. Its square resistivity is 10 ohm-cm when the thickness is 2000 Å. Its average transparency in the visible range exceeds 80%. It is usable in particular for motor vehicles as a heated window supplied by an alternator at 20 V.

Figure 3:
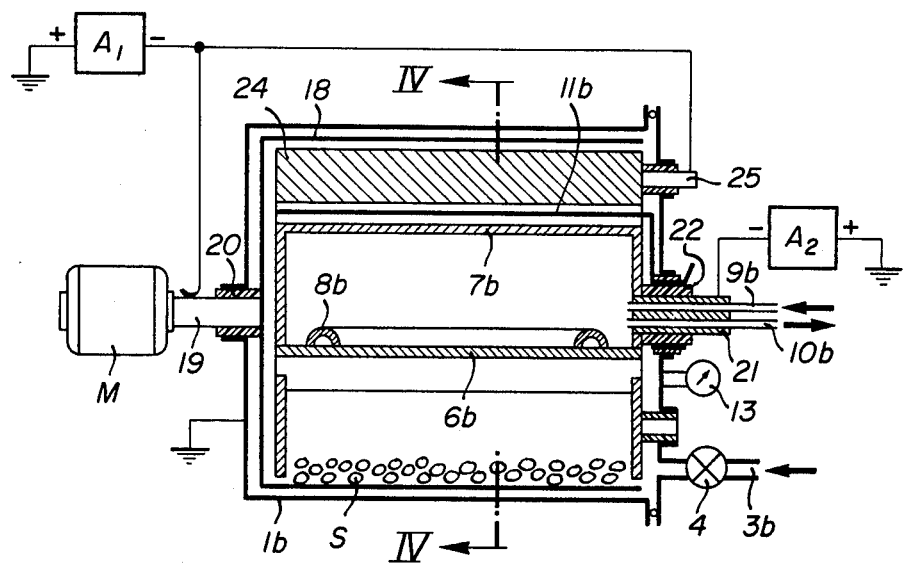
FIG. 3 is a longitudinal sectional view of an apparatus representing a third embodiment.
Figure 4:
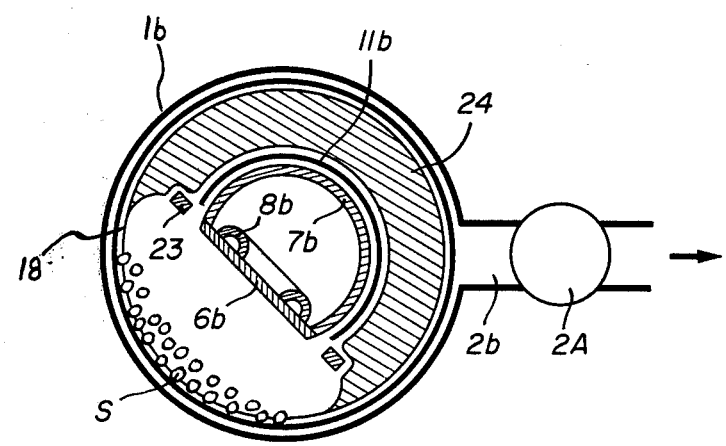
FIG. 4 is a cross-section on the line IV—IV of FIG. 3.

The device shown in FIGS. 3 and 4 is of particular interest because of the possibility of using a solid target and disposing it above the substrates.

To this end, the device comprises an enclosure 1b in which a drum 18 is rotatably mounted with the aid of a shaft 19 journaled in a bearing 20 insulated from ground. The drum is rotated by a motor and reducer M. A box 7b closed by the cathode target 6b, on the back of which is fixed an annular permanent magnet 8b, is mounted axially in the enclosure 1b by way of a rod 21 which is lodged in a bearing 22 insulated from ground. The rod 21 is penetrated by an inlet duct 9b to be connected to a cold-water supply and an outlet duct 10b for discharging the cooling water from the box 7b. The drum 18 acts as a support for the substrates S, which are loose pieces, and to this end is connected by the insulated shaft 19 to the negative pole of the first high-voltage source A$_1$, whereas the cathode target of the magnetron is connected to the negative pole of the second high-voltage source A$_2$ by the rod 21.

A grounded electrode 23 (FIG. 4) insulated from the enclosure 1b, serves as an anode for the production of the double discharge with the cathodes 6b and 18. An insert 24 insulated from the enclosure 1b and raised to the potential of the drum 18 by an insulated connection 25 occupies part of the enclosure 1b so as to limit the space in which the discharge can be produced. A screen 11b is rotatable about the bearing 22 and is at the potential of the drum 18.

As in the case of the previous embodiments, an exhaust port 2b connects the enclosure 1b to the vacuum pump 2A, whereas a conduit 3b and a precision valve 4 are provided to feed a gas into the enclosure under a pressure controlled by a gauge 13 which can operate an automatic control system (not shown) for the valve 4.

With the exception of the fact that the drum 18 rotates in order to turn over the pieces constituting the substrates S, the operation of the device is entirely analogous to that heretofore described.

EXAMPLE 6

The target 6b is of Au and the drum 18 is loaded with small screws, pins or miniature plugs for electrical connectors, or other small components S.

After evacuation to a pressure of less than $10^{-3}$ Torr, an Ar atmosphere at $2 \times 10^{-2}$ Torr is maintained by the valve 4, preferably controlled by the gauge 13. A negative voltage of 2 kV is applied to the drum shaft 19 and to the insert 24, and also to the screen 11b placed between the target 6b and the components S. The latter are then cleaned for about ten minutes, the drum 18 rotating at a speed between 10 and 30 r.p.m. Finally the screen 11b is retracted to a position between the insert 24 and box 7b by rotation about the drum axis whereupon a negative voltage of 400–600 V is applied to the rod 21 supporting the box 7b, and the pressure is lowered to $5 \times 10^{-3}$ Torr.

Au deposits at a rate corresponding to 2 $\mu$/min for an immobile substrate when the power on the target is 30 W/cm$^2$. As the substrates are in movement and are partially superimposed, this rate is reduced to about 0.2 $\mu$/min depending on the extent of the load.

FIG. 5 shows a modification of the previous device in which the enclosure 1c is inclined. The drum 18c is mounted on insulating rollers 17, one of which, designated 17a, is driven by a motor M. The elevated end of the enclosure 1c, near a raised edge of the bottom of drum 18c, has an entrance port connected to a loader 26, whereas the lower end is provided, at a lowered edge of the drum bottom, with an exit port connected to a collector 27 for the coated pieces. The inclination of the drum and its speed of rotation determine the time during which the pieces remain in the enclosure. As the operation is continuous, the active part of the cathode 6c must be shorter than the drum 18c so as to reserve that part of the drum which adjoins the loader 26 for the ionic cleaning of the substrates, and accordingly the magnet 8c does not extend as far as the upper end of the drum 18c. This eliminates the need for an interposable screen.

FIG. 6 shows a magnetron cathode in the form of multiple targets 6$_1$, 6$_2$, 6$_3$ and 6$_4$ which allow the selective deposition of four different substances. The permanent magnets of the preceding embodiments are replaced by electromagnets 8$_1$, 8$_2$, 8$_3$ and 8$_4$, respectively, to be selectively energized according to which target is to be used.

EXAMPLE 7

This example relates to the production of glass with strong reflectivity in the solar infrared range, such as that referred to in Example 3, by a combination of the techniques of Examples 3 and 5.

A very thin preliminary layer of less than 700 Å of mixed oxide of In + Sn is deposited in accordance with Example 5 in order to make the glass surface conducting, the surface then being subjected to reactive deposition of titanium in accordance with Example 3. To this end, the glass panes are placed in an enclosure rigorously isolated from that used for depositing the In + Sn in order to prevent any contamination by oxygen. The target is of pure titanium and the atmosphere is pure nitrogen.

To make this second deposit on the preliminary deposit of transparent conducting oxides, the glass pane is heated to about 300° C. The conducting layer is then polarized to a negative potential of about 200 V, this enabling the grid 5a (FIG. 2) to be dispensed with. The glass pane is then moved past the Ti target in an atmosphere of pure $N_2$ at $1-5 \times 10^{-3}$ Torr. With a power of 20 W/cm$^2$ on the target, the TiN deposits at a rate of about 1,000 Å/min. To obtain a layer of 230 Å of TiN, each portion of substrate surface must remain for approximately 20 seconds in front of the target. This superimposing of In + Sn and TiN layers is particularly advantageous and enables optical properties to be obtained which are equal, or even superior, to those obtained in Example 4.

It should also be noted that the method according to the present invention has particularly interesting applications in the processing of horological components, for example the application of hard wear-resistant coatings on pinions, the ends of spindles, teeth, escapement parts etc. In this respect, one of the advantages of the method is the fact that the hard coating may be applied to a polished substrate without changing the state of the polished surface. It could also be applied to deposit layers of self-lubricating metals or alloys. Thus it is known that one of the conditions for the effectiveness of such layers is their perfect adhesion to the substrate, so that the described method is particularly well adapted to this procedure. Furthermore, in the case of an alloy, the magnetron source has an advantage over sources in which the components of the alloy tend to evaporate because of their different vapor pressures.

The method according to my invention is also usable in depositing coatings on watch cases, dials or bracelets to protect them against scratching. Such coatings may also have the subsidiary or even main purpose of being decorative.

It should also be noted that the device of FIGS. 3 to 5 may be used in an ordinary sputtering process, in which case the substrate would form the anode and for this purpose would be connected to ground and not to the pole of the high-voltage source $A_1$.

I claim:

1. A method of ionically cleaning and coating a substrate, comprising the steps of:
    placing the substrate in the immediate vicinity of a cathode within a conductive enclosure containing a rarefied gaseous atmosphere;
    biasing said cathode sufficiently negative with reference to said enclosure to generate a glow discharge resulting in an ionic cleaning of the substrate with formation of a dark space adjacent said cathode;
    energizing a target electrode of coating material, confronting said cathode at a location in said enclosure beyond said dark space, with a negative voltage of lower absolute magnitude than that of cathode to generate a sputtering discharge between said target electrode and said enclosure, the potential difference between said cathode and said target electrode being sufficient to produce a discharge current at said target electrode of a magnitude substantially equal to that produced upon a like energization of the target electrode in the absence of said cathode; and
    setting up a magnetic field across said target electrode with lines of force closed on the side facing said cathode to establish an endless track for the circulation of secondary electrons emitted by said target electrode, with resulting intensification of the rate of emission of ions of coating material toward said substrate to exceed the rate of substrate erosion by said glow discharge whereby a deposit of coating material is built up on said substrate.

2. A method as defined in claim 1 wherein the energization of said target electrode is deferred beyond the initiation of said glow discharge to establish a time interval for the ionic cleaning of the substrate.

3. A method as defined in claim 2 wherein a screen is interposed between said target electrode and said cathode during said time interval.

4. A method as defined in claim 2 wherein the gas pressure of said rarefied atmosphere is lowered at the end of said time interval.

5. A method as defined in claim 1, comprising the further step of preheating said substrate before juxtaposing it with said cathode.

6. A method as defined in claim 1 wherein said substrate is first subjected to said glow discharge at a location remote from said magnetic field for ionic cleaning before being brought into the vicinity of said field for receiving said deposit.

7. A method as defined in claim 1 wherein said rarefied atmosphere comprises an inert gas, comprising the further step of admixing therewith a gas reactive with said coating material.

8. A method as defined in claim 7 wherein an initial deposit of coating material on said substrate is carried out in said inert gas, followed by a progressive replacement of the inert gas by said reactive gas with continuation of said glow discharge and sputtering discharge.

9. A method as defined in claim 8 wherein said coating material is metallic and said reactive gas is nitrogen.

10. A method as defined in claim 9 wherein said coating material is titanium and said substrate is made of steel, the pressure of said rarefied atmosphere being on the order of $10^{-2}$ Torr during buildup of said initial deposit and being lowered to the order of $10^{-3}$ Torr with introduction of the nitrogen.

11. A method as defined in claim 10, comprising the further step of heating said substrate during ionic cleaning to a temperature of substantially 450° to 600° C.

12. A method as defined in claim 11, comprising the further step of allowing said target to heat up to a temperature above a level of about 700° C. upon the lowering of said pressure.

13. A method as defined in claim 7 wherein said inert gas is argon and said reactive gas is oxygen, said coating material is an alloy of indium and tin, and said substrate is glass.

14. A method as defined in claim 13, comprising the further step of heating said substrate in air after the formation of said deposit to render same transparent.

15. A method as defined in claim 1 wherein said coating material is titanium nitride, said substrate is glass and said rarefied atmosphere consists of an inert gas, comprising the further step of preheating said substrate to a temperature on the order of 300° C. before juxtaposing it with said cathode.

16. An apparatus for ionically cleaning and coating a substrate, comprising:
- a conductive enclosure forming an ionization chamber, said enclosure being provided with circulation means for maintaining a rarefied gaseous atmosphere in said chamber;
- a cathode in said chamber insulated from said enclosure;
- a first direct-current source connected between said enclosure and said cathode for maintaining the latter at a negative potential relative to said enclosure sufficient to generate a glow discharge therebetween resulting in an ionic cleaning of a substrate disposed in the immediate vicinity of said cathode in said chamber, with formation of a dark space adjacent said cathode;
- a generally plate-shaped target electrode adapted to carry a coating material disposed in said chamber opposite said cathode at a location beyond said dark space in insulated relationship with said enclosure;
- a second direct-current source connected between said target electrode and said enclosure for biasing said target electrode with reference to said enclosure at a negative potential less than that of said cathode but high enough to generate a sputtering discharge between said target electrode and said enclosure, the first and second direct-current sources being adapted to maintain the potential difference between said target electrode and said cathode at a value sufficient to produce a discharge current at said target electrode of a magnitude substantially equal to that produced by said second source in the absence of said cathode; and
- magnetic means adjacent said target electrode with north and south poles trained along concentric lines upon a surface of said target electrode remote from said cathode, for providing a magnetic field with lines of force closed on the side facing said cathode to establish an endless track for the circulation of secondary electrons emitted by said target electrode with resulting intensification of the rate of emission of ions of coating material toward said substrate to exceed the rate of substrate erosion by said glow discharge whereby a deposit of said coating material is built up on said substrate.

17. An apparatus as defined in claim 16, further comprising a box within said chamber closed on one side by said target electrode and provided with inlet and outlet means for the circulation of a cooling fluid therethrough, said magnetic means being disposed in said box.

18. An apparatus as defined in claim 16 wherein said magnetic means comprises a permanent magnet of toroidal configuration.

19. An apparatus as defined in claim 16, further comprising screen means in said chamber selectively interposable between said target electrode and said cathode.

20. An apparatus as defined in claim 16 wherein said cathode is disposed below said target electrode and has an upper surface forming a support for said substrate.

21. An apparatus as defined in claim 16 wherein said cathode is disposed above said target electrode, further comprising support means in said chamber for holding said substrate in the vicinity of said cathode.

22. An apparatus as defined in claim 21 wherein said cathode is in the shape of a grid, said support means being located above said grid.

23. An apparatus as defined in claim 16 wherein said cathode is in the shape of a drum centered on a generally horizontal axis, further comprising drive means for rotating said drum about said axis, said target electrode and magnetic means being nonrotatably disposed in said drum.

24. An apparatus as defined in claim 23 wherein said axis is inclined at an angle to the horizontal, said enclosure being provided at opposite ends with an entrance port near a raised edge of the drum bottom and with an exit port near a lowered edge of the drum bottom for enabling the continuous passage of substrate parts through said chamber between the drum bottom and said target electrode.

25. An apparatus as defined in claim 24 wherein said magnetic means is axially separated from the entrance side of said drum to form a zone in which the entering substrate parts are subjected only to ionic cleaning.

* * * * *